United States Patent
Tang

(10) Patent No.: US 11,462,505 B2
(45) Date of Patent: Oct. 4, 2022

(54) SEMICONDUCTOR DEVICE ASSEMBLY AND METHOD THEREFOR

(71) Applicant: NXP USA, INC., Austin, TX (US)

(72) Inventor: Jinbang Tang, Chandler, AZ (US)

(73) Assignee: NXP USA, INC., Austin, TX (US)

(*) Notice: Subject to any disclaimer, the term of this patent is extended or adjusted under 35 U.S.C. 154(b) by 0 days.

(21) Appl. No.: 17/095,111

(22) Filed: Nov. 11, 2020

(65) Prior Publication Data
US 2022/0149000 A1    May 12, 2022

(51) Int. Cl.
| H01L 23/00 | (2006.01) |
| H01L 23/31 | (2006.01) |
| H01L 23/498 | (2006.01) |
| H01L 21/48 | (2006.01) |
| H01L 21/56 | (2006.01) |

(52) U.S. Cl.
CPC .......... *H01L 24/73* (2013.01); *H01L 21/4853* (2013.01); *H01L 21/565* (2013.01); *H01L 23/3128* (2013.01); *H01L 23/49838* (2013.01); *H01L 24/40* (2013.01); *H01L 24/48* (2013.01); *H01L 24/92* (2013.01); *H01L 2224/40227* (2013.01); *H01L 2224/48227* (2013.01); *H01L 2224/73221* (2013.01); *H01L 2224/92157* (2013.01)

(58) Field of Classification Search
CPC ............................................ H01L 2224/48227
See application file for complete search history.

(56) References Cited

U.S. PATENT DOCUMENTS

| 5,019,946 A | 5/1991 | Eichelberger et al. |
| 5,600,183 A | 2/1997 | Gates, Jr. |
| 5,640,760 A | 6/1997 | Val et al. |
| 6,140,581 A | 10/2000 | Cowan et al. |
| 6,420,208 B1 | 7/2002 | Pozder et al. |
| 7,243,421 B2 | 7/2007 | Bentley et al. |
| 7,829,997 B2 | 11/2010 | Hess et al. |
| 7,838,420 B2 | 11/2010 | Tang et al. |
| 7,838,979 B2 | 11/2010 | Oh |
| 7,972,650 B1 | 7/2011 | Church et al. |
| 8,216,918 B2 | 7/2012 | Gong et al. |
| 8,263,434 B2 | 9/2012 | Pagaila et al. |
| 8,513,767 B2 | 8/2013 | Kotlanka et al. |
| 8,647,979 B2 | 2/2014 | Yaniv et al. |

(Continued)

OTHER PUBLICATIONS

3DiS Technologies, Fact Sheet, Apr. 2019.
(Continued)

*Primary Examiner* — Yu-Hsi D Sun

(57) ABSTRACT

A method of forming a packaged semiconductor device includes attaching a backside surface of a semiconductor die to a major surface of a package substrate. A first conductive connector is formed over a portion of an active surface of the semiconductor die and a portion of the major surface of the package substrate. A first conductive connection between a first bond pad of the semiconductor die and a first substrate pad of the package substrate is formed by way of the first conductive connector. A bond wire connects a second bond pad of the semiconductor die to a second substrate pad of the package substrate. The first bond pad located between the second bond pad and an edge of the semiconductor die.

11 Claims, 4 Drawing Sheets

(56) References Cited

U.S. PATENT DOCUMENTS

| | | |
|---|---|---|
| 8,900,921 B2 | 12/2014 | Kim et al. |
| 9,202,792 B2 | 12/2015 | Yu et al. |
| 9,331,029 B2 | 5/2016 | Vincent et al. |
| 9,935,079 B1 | 4/2018 | Foong et al. |
| 2002/0105073 A1 | 8/2002 | Smith |
| 2005/0062171 A1 | 3/2005 | Hung |
| 2011/0012246 A1 | 1/2011 | Andrews, Jr. et al. |
| 2011/0024888 A1 | 2/2011 | Pagaila et al. |
| 2011/0037159 A1 | 2/2011 | McElrea et al. |
| 2011/0068444 A1 | 3/2011 | Chi et al. |
| 2012/0032340 A1 | 2/2012 | Choi et al. |
| 2012/0329212 A1 | 12/2012 | Leal |
| 2015/0049421 A1 | 2/2015 | Paek et al. |
| 2015/0163904 A1 | 6/2015 | Karhade et al. |
| 2015/0200177 A1 | 7/2015 | Foong et al. |
| 2015/0249043 A1 | 9/2015 | Elian et al. |
| 2015/0262931 A1 | 9/2015 | Vincent et al. |
| 2015/0328835 A1 | 11/2015 | Wu et al. |
| 2016/0093525 A1 | 3/2016 | Cook et al. |
| 2016/0099231 A1 | 4/2016 | Yang et al. |
| 2016/0190047 A1* | 6/2016 | Cahill .............. H01L 23/66 257/676 |

OTHER PUBLICATIONS

Optomec, "Aerosol Jet 300 Series Systems for Development of Printed Electronics and Biologics", Apr. 2017.

Paulsen, J., "Printing Conformal Electronics on 3D Structures with Aerosol Jet Technology", 2012 Future of Instrumentation International Workshop (FIIW) Proceedings, Oct. 2012.

Vincent, M., "Heterogeneous Sensor System in Package (SSiP) Integration using Wafer-Level Molding", SRC Project Update, Aug. 2020.

U.S. Appl. No. 17/063,763, filed Oct. 6, 2020, entitled "Semiconductor Device Assembly and Method Therefor".

Non-final office action dated Mar. 31, 2022 in U.S. Appl. No. 17/063,763.

* cited by examiner

SEMICONDUCTOR DEVICE ASSEMBLY AND METHOD THEREFOR

BACKGROUND

Field

This disclosure relates generally to semiconductor devices, and more specifically, to semiconductor device assembly and method of forming the same.

Related Art

Semiconductor devices are often found in a large spectrum of electronic products—from sewing machines to washing machines, from automobiles to cellular telephones, and so on. Such semiconductor devices generally include an integrated circuit die which communicates with the other devices outside of a package by way of bond wires, for example. As technology progresses, semiconductor manufacturing continues to seek ways to reduce costs and improve performance and reliability in these semiconductor devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a packaged semiconductor device including low profile, low impedance conductive connectors formed between a first plurality of bond pads on a semiconductor die and a first plurality of substrate pads on a package substrate. Bond wires interconnect a second plurality of bond pads on the semiconductor die and a second plurality of substrate pads on the package substrate. Power, ground, and critical high speed signal line connections, for example, can be formed using the conductive connectors allowing other signals to traverse over the conductive connectors by way of the bond wires. By routing power, ground, and critical high speed signal nets in this manner, higher density and higher performance semiconductor devices can be realized.

Figure 1:
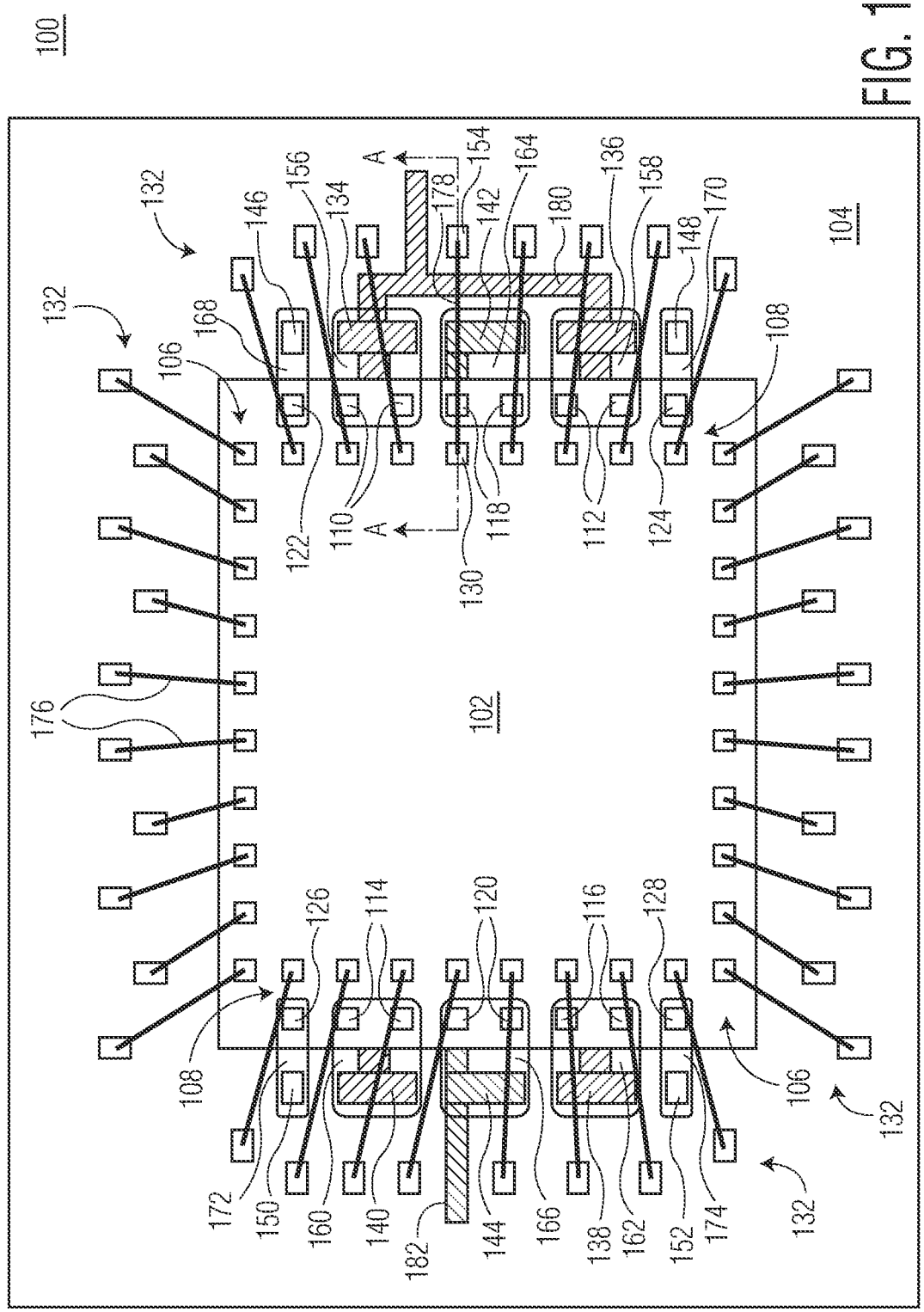
FIG. 1 illustrates, in a simplified plan view, an example packaged semiconductor device at a stage of manufacture in accordance with an embodiment.
Figure 2:
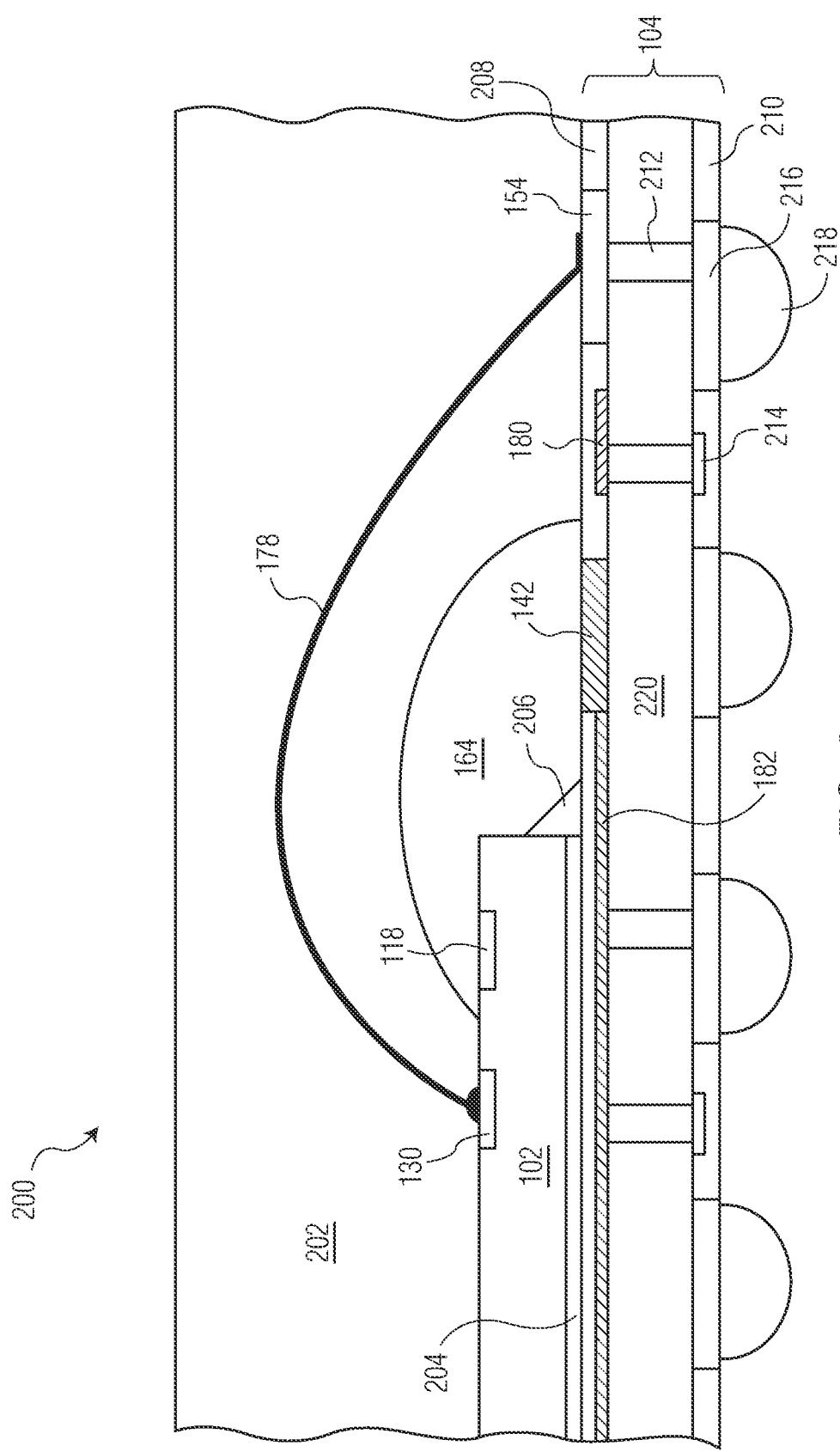
FIG. 2 illustrates, in a simplified cross-sectional view, the example packaged semiconductor device at a subsequent stage of manufacture in accordance with an embodiment.
Figure 3:
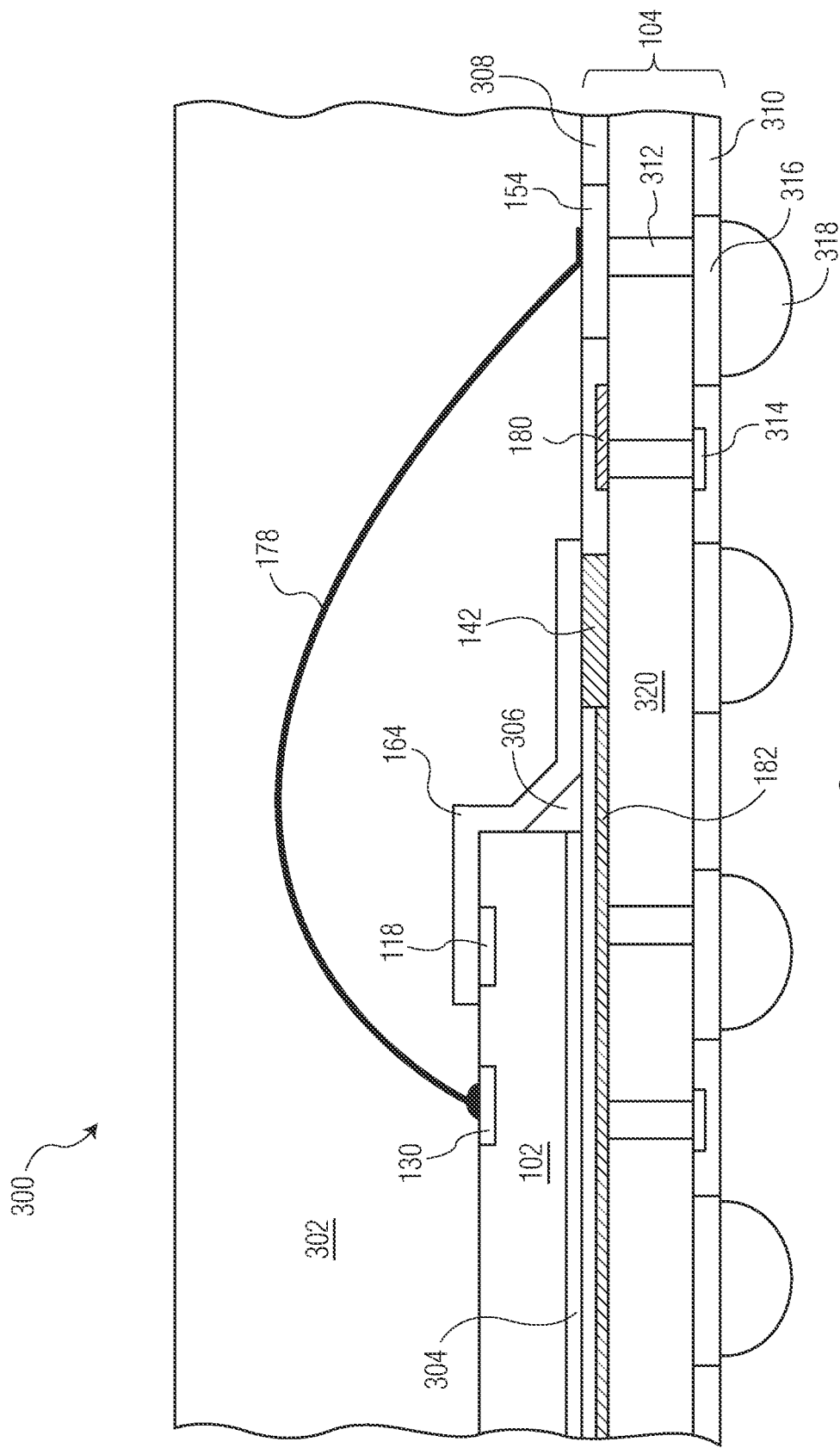
FIG. 3 illustrates, in a simplified cross-sectional view, an alternative example packaged semiconductor device at a stage of manufacture in accordance with an embodiment.
Figure 4:
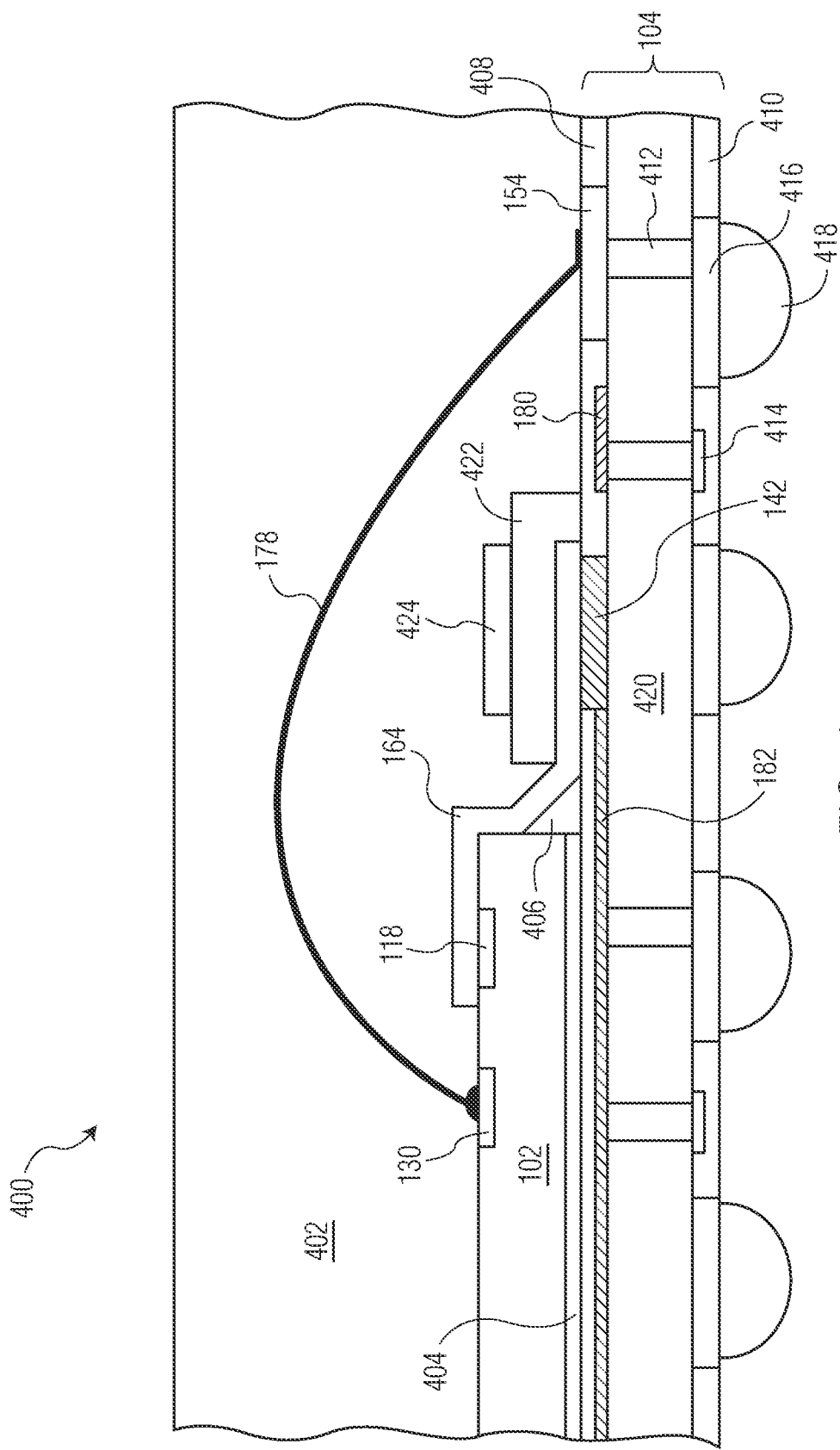
FIG. 4 illustrates, in a simplified cross-sectional view, another alternative example packaged semiconductor device at a stage of manufacture in accordance with an embodiment.

FIG. 1 illustrates, in a simplified plan view, an example packaged semiconductor device 100 at a stage of manufacture in accordance with an embodiment. At this stage, the device 100 includes a semiconductor die 102 attached to a package substrate 104, conductive connectors 156-174 connecting bond pads 110-128 with respective substrate pads 134-152, and bond wires 176-178 connecting respective bond pads 106-108 and 130 with respective substrate pads 132 and 154. In this embodiment, a backside surface of the semiconductor die 102 is attached to a first major surface (e.g., topside) of the package substrate 104 by way of a die attach material (not shown). Bond pads 106-130 are located at an active surface of the semiconductor die 102 and substrate pads 132-154 are located at the first major surface of the package substrate 104. In this embodiment, the package substrate 104 is characterized as a molded array process ball grid array (MAPBGA) type package substrate. A cross-sectional view of embodiments of the device 100 taken along line A-A is shown in FIG. 2 through FIG. 4.

The semiconductor die 102 includes core circuitry substantially surrounded by the bond pads 106-130 at the active surface of the die. In this embodiment, the core circuitry may include any type of circuits and functional blocks or combinations thereof such as a processor, memory, timer, serial communication unit, analog circuitry, RF circuitry, sensor, and others. The bond pads 106-130 are configured and arranged around the perimeter of the semiconductor die 102. A first plurality of bond pads 106 is located proximate to a first edge of the semiconductor die 102 and a second plurality of bond pads 106 is located proximate to a second edge opposite of the first edge. A third plurality of bond pads 110-112, 118, and 122-124 is arranged in a row located proximate to a third edge of the semiconductor die 102 and a fourth plurality of bond pads 108 is arranged in a row located proximate to the third plurality of bond pads. A fifth plurality of bond pads 114-116, 120, and 126-128 is arranged in a row located proximate to a fourth edge opposite of the third edge and a sixth plurality of bond pads 108 is arranged in a row located proximate to the fifth plurality of bond pads. The plurality of bond pads 106, 108, and 130 are configured and arranged for connection to the plurality of substrate pads 132 and 154 by way of the bond wires 176 and 178. The bond wires 176 and 178 may be formed from a suitable metal material such as aluminum, copper, silver, or gold.

Conductive connectors 156-174 are each formed over a portion of the semiconductor die 102 and a portion of the package substrate 104. The conductive connectors 156-174 are each formed directly contacting respective bond pads 110-128 of the semiconductor die 102 and directly contacting corresponding substrate pads 134-152. The conductive connectors 156-174 may be formed by way of a dispensing, jetting, or three-dimensional (3-D) printing process, for example. Accordingly, conductive connections formed by way of the conductive connectors 156-174 inherently have lower series resistance and lower inductance values when compared to bond wires, for example. In one embodiment, the conductive connectors 156-174 may be formed from a dispensed solder paste material. In another embodiment, the conductive connectors 156-174 may be formed as 3-D printed connections between respective bond pads 110-128 and corresponding substrate pads 134-152.

Because the conductive connectors 156-174 utilize the bond pads 110-128 proximate to the edges of the semiconductor die 102 and corresponding substrate pads 134-152 to form conductive connections, additional conductive connections can be made by way of bond wires 176 and 178 overlapping the conductive connectors 156-174 to form conductive connections between bond pads 108 and 130 and substrate pads 132 and 154. In this manner, die area and package substrate area can be optimized while forming the conductive connections between the semiconductor die 102 and the package substrate 104. For example, it may be desirable for critical high frequency signal nets to utilize conductive connectors 168-174 and for power supply nets to utilize conductive connectors 156-166.

In this embodiment, the trace 180 of the package substrate 104 may be characterized as a ground trace configured for connection to a ground voltage supply and the bond pads 110-114 may be characterized as ground pads configured for supplying a ground voltage to the semiconductor die 102. The trace 180 is further routed below the semiconductor die 102 to interconnect substrate pads 134-140. As a result, the conductive connectors 156-162 form low resistance, low inductance conductive connections between the trace 180 of the package substrate 104 and the semiconductor die 102. Similarly, the trace 182 of the package substrate 104 may be characterized as a power trace configured for connection to a voltage supply (e.g., VDD) and the bond pads 118-120 may be characterized as power pads configured for supplying an operating voltage to the semiconductor die 102. The trace 182 is further routed below the semiconductor die 102 to interconnect substrate pads 142 and 144. As a result, the conductive connectors 164 and 166 form low resistance, low inductance conductive connections between the trace 182 of the package substrate 104 and the semiconductor die 102. With the ground and power voltages supplied to the semiconductor die 102 in this manner, inductance generally associated with bond wire connections is reduced resulting in less noise and improved high frequency performance.

FIG. 2 illustrates, in a simplified cross-sectional view, an example packaged semiconductor device 200 at a stage of manufacture in accordance with an embodiment. The device 200 shown in FIG. 2 is an embodiment representative of the portion of device 100 taken along line A-A of FIG. 1. In this embodiment, the device 200 includes the backside surface of the semiconductor die 102 attached to the topside surface of the package substrate 104 by way of die attach material 204 and encapsulated with an encapsulant 202. The encapsulant (e.g., epoxy material) 202 is shown encapsulating the semiconductor die 102, exposed portion of the package substrate 104, the bond wire 178, and the conductive connector 164.

The bond pad 118 located at the active surface of the semiconductor die 102 is conductively connected to the substrate pad 142 of the package substrate 104 by way of the conductive connector 164. For example, the conductive connector 164 is formed over a portion of the semiconductor die 102 directly contacting the bond pad 118 and a portion of the package substrate 104 directly contacting the substrate pad 142. In the embodiment of FIG. 2, the conductive connector 164 is formed from a dispensed solder paste material and reflowed to form a conductive connection between the bond pad 118 and the substrate pad 142. A non-conductive fillet 206 may be formed at the semiconductor die 102 to the package substrate 104 transition to improve step coverage of the solder material at the transition. The bond pad 130 located at the active surface of the semiconductor die 102 is conductively connected to the substrate pad 154 of the package substrate 104 by way of the bond wire 178. In this embodiment, at least a portion of the bond wire 178 overlaps at least a portion of the conductive connector 164. In this embodiment, the conductive connection formed between the bond pad 130 and the substrate pad 154 is separate from the conductive connection formed between the bond pad 118 and the substrate pad 142.

The package substrate 104, as depicted in FIG. 2, has a first major surface (e.g., top surface) and a second major surface (e.g., bottom surface) opposite of the first major surface. In this embodiment, the package substrate 104 is formed as a multi-layer laminate structure. For example, the package substate 104 includes a first conductive layer (e.g., metal) located at the first major surface and a second conductive layer located at the second major surface. The first conductive layer and the second conductive layer are separated by a non-conductive material (e.g., fiber reinforced epoxy material) 220. In this embodiment, the first conductive layer is patterned to form conductive traces 180-182 and substrate pads 142 and 154, and the second conductive layer is patterned to form conductive traces 214 and connector pads 216. Conductive vias 212 are formed to provide conductive connections between the conductive features of the first conductive layer (e.g., conductive traces 180-182, substrate pads 142, 154) and the conductive features of the second conductive layer (e.g., conductive traces 214 and connector pads 216), for example. A non-conductive layer (e.g., solder mask) 208 is formed over the top surface of the package substrate 104 embedding the conductive traces 180-182. Openings formed in the solder mask layer 208 expose the substrate pads 142 and 154 to allow for connections to the semiconductor die 102 by way of respective conductive connector 164 and bond wires 178, for example. A non-conductive layer (e.g., solder mask) 210 is formed over the bottom surface of the package substrate 104 embedding the conductive traces 214. Openings formed in the solder mask layer 210 expose connector pads 216 to allow for connections to a printed circuit board (PCB) by way of respective ball connectors 218, for example. The ball connectors 218 may be any suitable conductive structure such as solder balls, gold studs, copper pillars, and the like, to connect conductive features of the package 200 with the PCB.

FIG. 3 illustrates, in a simplified cross-sectional view, an alternative example packaged semiconductor device 300 at a stage of manufacture in accordance with an embodiment. The device 300 shown in FIG. 3 is an embodiment representative of the portion of device 100 taken along line A-A of FIG. 1. In this embodiment, the device 300 includes the backside surface of the semiconductor die 102 attached to the topside surface of the package substrate 104 by way of die attach material 304 and encapsulated with an encapsulant 302. The encapsulant (e.g., epoxy material) 302 is shown encapsulating the semiconductor die 102, exposed portion of the package substrate 104, the bond wire 178, and the conductive connector 164.

The bond pad 118 located at the active surface of the semiconductor die 102 is conductively connected to the substrate pad 142 of the package substrate 104 by way of the conductive connector 164. For example, the conductive connector 164 is formed over a portion of the semiconductor die 102 directly contacting the bond pad 118 and a portion of the package substrate 104 directly contacting the substrate pad 142. In the embodiment of FIG. 3, the conductive connector 164 is formed from a 3-D printed conductive (e.g., low resistivity metal) material to form a conductive connection between the bond pad 118 and the substrate pad 142. A non-conductive fillet 306 may be formed at the semiconductor die 102 to the package substrate 104 transition to improve step coverage of the 3-D printed material at the transition. The bond pad 130 located at the active surface of the semiconductor die 102 is conductively connected to the substrate pad 154 of the package substrate 104 by way of the bond wire 178. In this embodiment, at least a portion of the bond wire 178 overlaps at least a portion of the conductive connector 164. In this embodiment, the conductive connection formed between the bond pad 130 and the substrate pad 154 is separate from the conductive connection formed between the bond pad 118 and the substrate pad 142.

The package substrate 104, as depicted in FIG. 3 includes a first conductive layer (e.g., metal) located at the first major surface and a second conductive layer located at the second major surface. The first conductive layer and the second conductive layer are separated by a non-conductive material 320. In this embodiment, the first conductive layer is patterned to form conductive traces 180-182 and substrate pads 142 and 154, and the second conductive layer is patterned to form conductive traces 314 and connector pads 316. Conductive vias 312 are formed to provide conductive connections between the conductive features of the first conductive layer (e.g., conductive traces 180-182, substrate pads 142, 154) and the conductive features of the second conductive layer (e.g., conductive traces 314 and connector pads 316), for example. A non-conductive layer 308 is formed over the top surface of the package substrate 104 embedding the conductive traces 180-182. Openings formed in the solder mask layer 308 expose the substrate pads 142 and 154 to allow for connections to the semiconductor die 102 by way of respective conductive connector 164 and bond wires 178, for example. A non-conductive layer 310 is formed over the bottom surface of the package substrate 104 embedding the conductive traces 314. Openings formed in the solder mask layer 310 expose connector pads 316 to allow for connections to a printed circuit board (PCB) by way of respective ball connectors 318, for example. The ball connectors 318 may be any suitable conductive structure such as solder balls, gold studs, copper pillars, and the like, to connect conductive features of the package 300 with the PCB.

FIG. 4 illustrates, in a simplified cross-sectional view, another alternative example packaged semiconductor device 400 at a stage of manufacture in accordance with an embodiment. The device 400 shown in FIG. 4 is an embodiment representative of the portion of device 100 taken along line A-A of FIG. 1. In this embodiment, the device 400 includes the backside surface of the semiconductor die 102 attached to the topside surface of the package substrate 104 by way of die attach material 404 and encapsulated with an encapsulant 402. The encapsulant 402 is shown encapsulating the semiconductor die 102, exposed portion of the package substrate 104, the bond wire 178, portions of the conductive connector 164, and an overlapping conductive layer 424.

The bond pad 118 located at the active surface of the semiconductor die 102 is conductively connected to the substrate pad 142 of the package substrate 104 by way of the conductive connector 164. For example, the conductive connector 164 is formed over a portion of the semiconductor die 102 directly contacting the bond pad 118 and a portion of the package substrate 104 directly contacting the substrate pad 142. In the embodiment of FIG. 4, the conductive connector 164 is formed from a 3-D printed conductive (e.g., low resistivity metal) material to form a conductive connection between the bond pad 118 and the substrate pad 142. A non-conductive fillet 406 may be formed at the semiconductor die 102 to the package substrate 104 transition to improve step coverage of the 3-D printed material at the transition. The bond pad 130 located at the active surface of the semiconductor die 102 is conductively connected to the substrate pad 154 of the package substrate 104 by way of the bond wire 178. In this embodiment, a non-conductive layer 422 is 3-D printed over a portion of the conductive connector 164. A subsequent conductive trace 424 is 3-D printed over the non-conductive layer 422 to form a conductive interconnect, for example. The conductive trace 424 may be interconnected with other underlying conductive features by way of a 3-D printed via (not shown). The conductive interconnect formed by conductive trace 424 allows for interconnect to be stacked over substrate pads, for example, to optimize the package substrate area. In this embodiment, at least a portion of the bond wire 178 overlaps at least a portion of the conductive connector 164 and/or a portion of the conductive trace 424. In this embodiment, the conductive connection formed between the bond pad 130 and the substrate pad 154 is separate from the conductive connection formed between the bond pad 118 and the substrate pad 142.

The package substrate 104, as depicted in FIG. 4 includes a first conductive layer (e.g., metal) located at the first major surface and a second conductive layer located at the second major surface. The first conductive layer and the second conductive layer are separated by a non-conductive material 420. In this embodiment, the first conductive layer is patterned to form conductive traces 180-182 and substrate pads 142 and 154, and the second conductive layer is patterned to form conductive traces 414 and connector pads 416. Conductive vias 412 are formed to provide conductive connections between the conductive features of the first conductive layer (e.g., conductive traces 180-182, substrate pads 142, 154) and the conductive features of the second conductive layer (e.g., conductive traces 414 and connector pads 416), for example. A non-conductive layer 408 is formed over the top surface of the package substrate 104 embedding the conductive traces 180-182. Openings formed in the solder mask layer 408 expose the substrate pads 142 and 154 to allow for connections to the semiconductor die 102 by way of respective conductive connector 164 and bond wires 178, for example. A non-conductive layer 410 is formed over the bottom surface of the package substrate 104 embedding the conductive traces 414. Openings formed in the solder mask layer 410 expose connector pads 416 to allow for connections to a printed circuit board (PCB) by way of respective ball connectors 418, for example. The ball connectors 418 may be any suitable conductive structure such as solder balls, gold studs, copper pillars, and the like, to connect conductive features of the package 400 with the PCB.

Generally, there is provided, a packaged semiconductor device including a package substrate having a plurality of substrate pads formed at a first major surface; a semiconductor die having an active surface and a backside surface, the backside surface of the semiconductor die attached to the first major surface of the package substrate; a first conductive connector applied over a first portion of the semiconductor die and a first portion of the package substrate, a first conductive connection between a first bond pad of the semiconductor die and a first substrate pad of the plurality of substrate pads formed by way of the first conductive connector; and a bond wire having a first end connected to a second bond pad of the semiconductor die and a second end connected to a second substrate pad of the plurality of substrate pads, at least a portion of the bond wire overlapping at least a portion of the first conductive connector. The first conductive connector may be formed from a dispensed solder-based material or a 3-D printed conductive material. The package substrate may be characterized as a multi-layer laminate package substrate. The first bond pad of the semiconductor die may be one of a first plurality of bond pads formed in a first row proximate to a first edge of the semiconductor die and wherein the second bond pad of the semiconductor die may be one of a second plurality of bond pads formed in a second row, the first plurality of bond pads located between the second plurality of bond pads and the first edge of the semiconductor die. The packaged semiconductor device may further include a second conductive connector applied over a second portion of the semiconductor die and a second portion of the package substrate, a second conductive connection between a third bond pad of the semiconductor die and a third substrate pad of the plurality of substrate pads formed by way of the second conductive connector, the first conductive connection and the second conductive connection configured to carry signals different from one another. The first conductive connection may be characterized as a power supply connection and the second conductive connection may be characterized as a critical net connection. The packaged semiconductor device may further include a plurality of ball connectors affixed at a second major surface of the package substrate. The packaged semiconductor device may further include a non-conductive fillet formed at the semiconductor die to package substrate transition. The package substrate may be characterized as a molded array process ball grid array (MAPBGA) type package substrate.

In another embodiment, there is provided, a method of forming a packaged semiconductor device including attaching a backside surface of a semiconductor die to a first major surface of a package substrate; forming a first conductive connector over a first portion of an active surface of the semiconductor die and a first portion of the first major surface of the package substrate, a first conductive connection between a first bond pad of the semiconductor die and a first substrate pad of the package substrate formed by way of the first conductive connector; and connecting by way of a bond wire a second bond pad of the semiconductor die to a second substrate pad of the package substrate, the first bond pad located between the second bond pad and an edge of the semiconductor die. The first conductive connector may include 3-D printing a conductive path between the first bond pad of the semiconductor die and the first substrate pad of the package substrate. At least a portion of the bond wire may overlap at least a portion of the first conductive connector. The method may further include encapsulating with a molding compound the semiconductor die, a portion of the package substrate, the first conductive connector, and the bond wire. The method may further include forming a non-conductive fillet at the semiconductor die to package substrate transition, the first conductive connector directly contacting the conductive fillet. The method may further include forming a second conductive connector over a second portion of the active surface of the semiconductor die and a second portion of the first major surface of the package substrate, a second conductive connection between a third bond pad of the semiconductor die and a third substrate pad of the package substrate formed by way of the second conductive connector, the first conductive connection and the second conductive connection configured to carry signals different from one another. The method may further include affixing a plurality of ball connectors at a second major surface of the package substrate.

In yet another embodiment, there is provided, a method of forming a packaged semiconductor device including attaching a backside surface of a semiconductor die to a first major surface of a package substrate; forming a first conductive connector over a first portion of an active surface of the semiconductor die and a first portion of the first major surface of the package substrate, a first conductive connection between a first bond pad of the semiconductor die and a first substrate pad of the package substrate formed by way of the first conductive connector; and connecting by way of a bond wire a second bond pad of the semiconductor die to a second substrate pad of the package substrate, at least a portion of the bond wire overlapping at least a portion of the first conductive connector. Forming the first conductive connector may include 3-D printing a conductive path between the first bond pad of the semiconductor die and the first substrate pad of the package substrate. The first bond pad of the semiconductor die may be one of a first plurality of bond pads formed in a first row proximate to a first edge of the semiconductor die and wherein the second bond pad of the semiconductor die may be one of a second plurality of bond pads formed in a second row, the first plurality of bond pads located between the second plurality of bond pads and the first edge of the semiconductor die. The method may further include forming a second conductive connector over a second portion of the active surface of the semiconductor die and a second portion of the first major surface of the package substrate, a second conductive connection between a third bond pad of the semiconductor die and a third substrate pad of the plurality of substrate pads formed by way of the second conductive connector, the first conductive connection and the second conductive connection configured to carry signals different from one another.

By now it should be appreciated that there has been provided, a packaged semiconductor device including low profile, low impedance conductive connectors formed between a first plurality of bond pads on a semiconductor die and a first plurality of substrate pads on a package substrate. Bond wires interconnect a second plurality of bond pads on the semiconductor die and a second plurality of substrate pads on the package substrate. Power, ground, and critical high speed signal line connections, for example, can be formed using the conductive connectors allowing other signals to traverse over the conductive connectors by way of the bond wires. By routing power, ground, and critical high speed signal nets in this manner, higher density and higher performance semiconductor devices can be realized.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a packaged semiconductor device, the method comprising:
   attaching a backside surface of a semiconductor die to a first major surface of a package substrate;
   forming a first conductive connector over a first portion of an active surface of the semiconductor die and a first portion of the first major surface of the package substrate, a first conductive connection between a first bond pad of the semiconductor die and a first substrate pad of the package substrate formed by way of the first conductive connector;

forming a non-conductive fillet at the semiconductor die to package substrate transition, the first conductive connector directly contacting the conductive fillet; and connecting by way of a bond wire a second bond pad of the semiconductor die to a second substrate pad of the package substrate, the first bond pad located between the second bond pad and an edge of the semiconductor die.

2. The method of claim 1, wherein forming the first conductive connector includes 3-D printing a conductive path between the first bond pad of the semiconductor die and the first substrate pad of the package substrate.

3. The method of claim 1, wherein at least a portion of the bond wire overlaps at least a portion of the first conductive connector.

4. The method of claim 1, further comprising encapsulating with a molding compound the semiconductor die, a portion of the package substrate, the first conductive connector, and the bond wire.

5. The method of claim 1, further comprising forming a second conductive connector over a second portion of the active surface of the semiconductor die and a second portion of the first major surface of the package substrate, a second conductive connection between a third bond pad of the semiconductor die and a third substrate pad of the package substrate formed by way of the second conductive connector, the first conductive connection and the second conductive connection configured to carry signals different from one another.

6. The method of claim 1, further comprising affixing a plurality of ball connectors at a second major surface of the package substrate.

7. A method of forming a packaged semiconductor device, the method comprising:
   attaching a backside surface of a semiconductor die to a first major surface of a package substrate;
   forming a first conductive connector over a first portion of an active surface of the semiconductor die and a first portion of the first major surface of the package substrate, a first conductive connection between a first bond pad of the semiconductor die and a first substrate pad of the package substrate formed by way of the first conductive connector, wherein forming the first conductive connector includes 3-D printing a conductive path between the first bond pad of the semiconductor die and the first substrate pad of the package substrate; and
   connecting by way of a bond wire a second bond pad of the semiconductor die to a second substrate pad of the package substrate, at least a portion of the bond wire overlapping at least a portion of the first conductive connector.

8. The method of claim 7, wherein the first bond pad of the semiconductor die is one of a first plurality of bond pads formed in a first row proximate to a first edge of the semiconductor die and wherein the second bond pad of the semiconductor die is one of a second plurality of bond pads formed in a second row, the first plurality of bond pads located between the second plurality of bond pads and the first edge of the semiconductor die.

9. The method of claim 7, further comprising forming a second conductive connector over a second portion of the active surface of the semiconductor die and a second portion of the first major surface of the package substrate, a second conductive connection between a third bond pad of the semiconductor die and a third substrate pad of the plurality of substrate pads formed by way of the second conductive connector, the first conductive connection and the second conductive connection configured to carry signals different from one another.

10. A method of forming a packaged semiconductor device, the method comprising:
   attaching a backside surface of a semiconductor die to a first major surface of a package substrate;
   forming a first conductive connector over a first portion of an active surface of the semiconductor die and a first portion of the first major surface of the package substrate, a first conductive connection between a first bond pad of the semiconductor die and a first substrate pad of the package substrate formed by way of the first conductive connector, wherein forming the first conductive connector includes 3-D printing a conductive path between the first bond pad of the semiconductor die and the first substrate pad of the package substrate; and
   connecting by way of a bond wire a second bond pad of the semiconductor die to a second substrate pad of the package substrate, the first bond pad located between the second bond pad and an edge of the semiconductor die.

11. A method of forming a packaged semiconductor device, the method comprising:
   attaching a backside surface of a semiconductor die to a first major surface of a package substrate;
   forming a first conductive connector over a first portion of an active surface of the semiconductor die and a first portion of the first major surface of the package substrate, a first conductive connection between a first bond pad of the semiconductor die and a first substrate pad of the package substrate formed by way of the first conductive connector;
   forming a non-conductive fillet at the semiconductor die to package substrate transition, the first conductive connector directly contacting the conductive fillet; and
   connecting by way of a bond wire a second bond pad of the semiconductor die to a second substrate pad of the package substrate, at least a portion of the bond wire overlapping at least a portion of the first conductive connector.

* * * * *